United States Patent
Malaga et al.

(10) Patent No.: US 10,735,086 B2
(45) Date of Patent: Aug. 4, 2020

(54) SYSTEM AND METHOD FOR AN INTEGRATED VEHICLE COMMUNICATIONS SYSTEM

(71) Applicant: Honeywell International Inc., Morris Plains, NJ (US)

(72) Inventors: Alfonso Malaga, Sammamish, WA (US); Thomas D. Judd, Woodinville, WA (US); Christophe Ceccom, Blagnac (FR); Stephane Marche, Toulouse (FR)

(73) Assignee: Honeywell International Inc., Morris Plains, NJ (US)

( * ) Notice: Subject to any disclaimer, the term of this patent is extended or adjusted under 35 U.S.C. 154(b) by 97 days.

(21) Appl. No.: 16/054,485

(22) Filed: Aug. 3, 2018

(65) Prior Publication Data
US 2020/0044729 A1   Feb. 6, 2020

(51) Int. Cl.
| | |
|---|---|
| H04W 4/48 | (2018.01) |
| H04W 88/06 | (2009.01) |
| H04B 7/185 | (2006.01) |
| H01Q 5/25 | (2015.01) |
| G07C 5/00 | (2006.01) |
| H03G 3/34 | (2006.01) |
| H03M 1/12 | (2006.01) |
| H04B 7/0413 | (2017.01) |

(Continued)

(52) U.S. Cl.
CPC ......... *H04B 7/18506* (2013.01); *G07C 5/008* (2013.01); *H01Q 5/25* (2015.01); *H03G 3/34* (2013.01); *H03M 1/123* (2013.01); *H04B 7/0413* (2013.01); *H04W 4/48* (2018.02); *H01Q 1/28* (2013.01); *H04L 5/16* (2013.01)

(58) Field of Classification Search
CPC ........................... H04W 4/00; H04W 4/40–48
See application file for complete search history.

(56) References Cited

U.S. PATENT DOCUMENTS

| | | |
|---|---|---|
| 6,721,559 B1 | 4/2004 | Kocin et al. |
| 7,698,025 B1 | 4/2010 | Cornell et al. |

(Continued)

FOREIGN PATENT DOCUMENTS

EP   1865611 A2   12/2007

OTHER PUBLICATIONS

Shankar, "Communication Management Unit: Single Solution of Voice and Data Routing Unit", "Defence Science Journal", Dated Mar. 2013, pp. 181-185, vol. 63, No. 2, Publisher: DESIDOC.

(Continued)

*Primary Examiner* — San Htun
(74) *Attorney, Agent, or Firm* — Fogg & Powers LLC (57) ABSTRACT

A communications system is provided. The communications system comprises: at least one wideband remote radio system each of which is configured to be coupled to at least one antenna; a baseband system coupled to each of the at least one wideband remote radio system; wherein at least one wideband remote radio system and the baseband system are in different locations of a vehicle; wherein the baseband system comprises a datalink communications management system and an audio processing system; and wherein the at least one wideband radio baseband system is coupled to the audio processing system and the datalink communications management system.

12 Claims, 5 Drawing Sheets

(51) Int. Cl.
  *H01Q 1/28* (2006.01)
  *H04L 5/16* (2006.01)

(56) References Cited

U.S. PATENT DOCUMENTS

| | | |
|---|---|---|
| 8,019,338 B2 | 9/2011 | Malaga et al. |
| 8,103,271 B2 | 1/2012 | Calderhead et al. |
| 8,711,993 B2 | 4/2014 | Malaga et al. |
| 9,094,087 B2 | 7/2015 | Malaga |
| 2004/0203697 A1* | 10/2004 | Finn ................. G08C 17/02 |
| | | 455/420 |
| 2005/0277440 A1* | 12/2005 | Van Bosch .......... H04B 1/3822 |
| | | 455/557 |
| 2007/0015485 A1* | 1/2007 | DeBiasio ............... H04B 1/082 |
| | | 455/345 |
| 2009/0023394 A1 | 1/2009 | Ulloa-Sanzo et al. |
| 2010/0234071 A1* | 9/2010 | Shabtay ............... H04B 7/0408 |
| | | 455/562.1 |
| 2018/0138935 A1 | 5/2018 | Baek et al. |

OTHER PUBLICATIONS

European Patent Office, "Extended European Search Report from EP Application No. 19188712.4", from Foreign Counterpart to U.S. Appl. No. 16/054,485, dated Dec. 5, 2019, pp. 1-8, Published: EP.

* cited by examiner

SYSTEM AND METHOD FOR AN INTEGRATED VEHICLE COMMUNICATIONS SYSTEM

BACKGROUND

Modern aircraft include many separate systems, e.g. line replaceable units (LRUs), to implement a communications system of the aircraft. For example, radios and a datalink communications management system are implemented in separate systems. However, this increases size, weigh, power, and cost (SWaP-C) of the communications system. For example, standardized communications between the datalink communications management system and radios must be implemented according to standards. Such implementations are costly and complex. Therefore, there is a need to reduce SWaP-C and complexity.

SUMMARY

In one embodiment, a method is provided. The method comprises: receiving, in a wideband remote radio system of a vehicle, an incoming signal comprising at least one of a modulated data and a modulated audio signal; amplifying, in the wideband remote radio system of the vehicle, the incoming signal; digitizing the amplified incoming signal; down converting and demodulating, in one of the wideband remote radio system or the baseband processing system of the vehicle, the digitized, amplified incoming signal; transmitting, from the wideband remote radio system to the baseband processing system, the digitized, amplified incoming signal or a down converted and demodulated, digitized, amplified incoming signal; in the baseband processing system of the vehicle, decoding the down converted and demodulated, digitized, amplified incoming signal to create at least one of a data and a digital audio signal; if the decoded, down converted and demodulated, digitized, amplified incoming signal comprises a data message, then, in the baseband processing system of the vehicle, routing the data to at least one of: (a) at least one vehicle system, and (b) at least one application in the baseband processing system; and if the decoded, down converted and demodulated digitized, amplified incoming signal comprises a digitized audio signal, then, in the baseband processing system of the vehicle, routing the digitized audio signal to at least one vehicle audio system.

In another embodiment, a communications system is provided. The communications system comprises: at least one wideband remote radio system each of which is configured to be coupled to at least one antenna; a baseband system coupled to each of the at least one wideband remote radio system; wherein at least one wideband remote radio system and the baseband system are in different locations of a vehicle; wherein the baseband system comprises a datalink communications management system and an audio processing system; and wherein the at least one wideband radio baseband system is coupled to the audio processing system and the datalink communications management system.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding background and summary, or the following detailed description.

Subsequently illustrated exemplary embodiments reduce SWaP-C and complexity by repartitioning radio implementations. The baseband processing of the radio is combined with the datalink communications management system in a baseband processing system. The remaining portion of the radio is implemented in a separate wideband remote radio system. As a result, standardized communications between the datalink communications management system and radios is no longer required. Thus, ARINC buses and corresponding software used in conventional systems to couple a radio system to a datalink communications management system are no longer needed. Also, the audio processing system is included in the baseband processing system. Optionally, a management, monitoring, and/or reporting system may be included in the baseband processing system. Further, the size and number of LRUs used to implement communications systems may be reduced by such consolidation.

For pedagogical purposes, a vehicle may be described hereinafter as an aircraft. However, it is understood that the teachings herein are applicable to other types of vehicles including without limitation space craft, ships, automobiles, buses, trains, and any other vehicle. Thus, a pilot of an aircraft is more generically referred to as an operator of a vehicle 101. An airline is more generically referred to as an owner of a vehicle.

Figure 1:
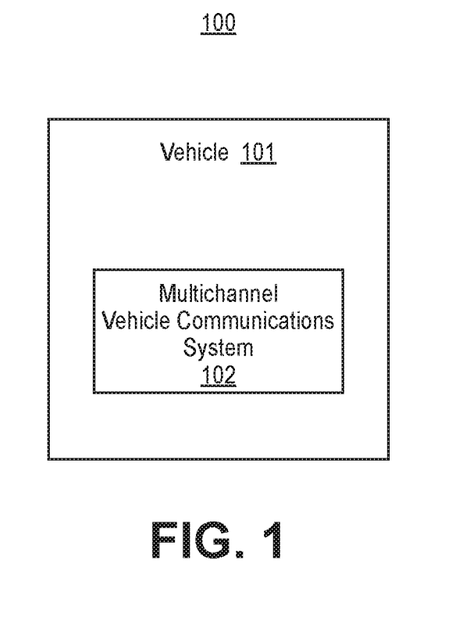
FIG. 1 illustrates a vehicle incorporating a multichannel communications system.

FIG. 1 illustrates a vehicle incorporating a multichannel communications system 100. The multichannel communications system 102 is installed in and/or on the vehicle 101.

Figure 2:
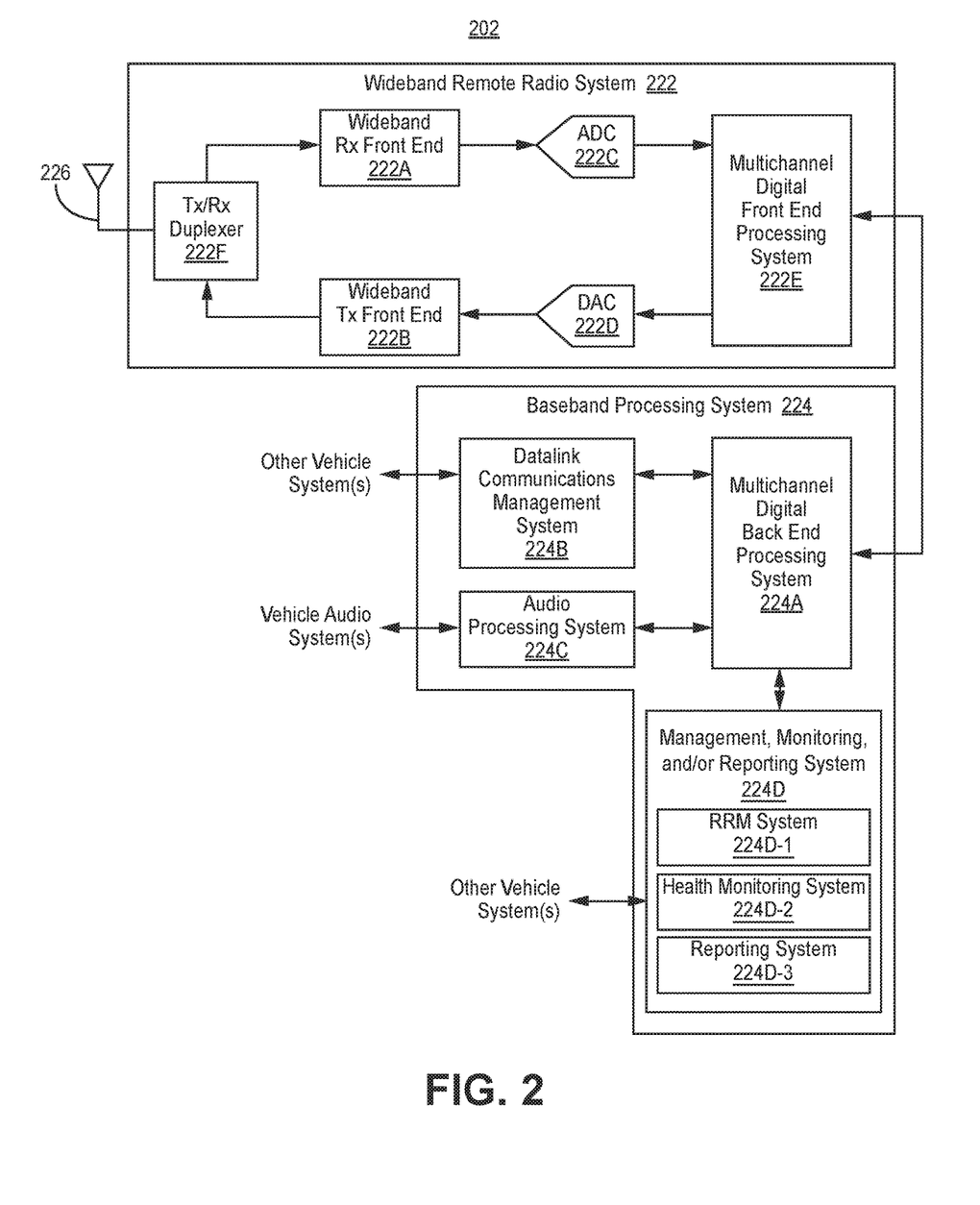
FIG. 2 illustrates one embodiment of a multichannel communications system.

FIG. 2 illustrates one embodiment of a multichannel communications system 202. The multichannel communications system 202 may communicate analog and/or digital information. Optionally, the multichannel communications system 202 may be implemented as a software defined radio.

The multichannel communications system 202 is configured to simultaneously receive communications in two or more channels, e.g. corresponding to two or more communications links. In another embodiment, the multichannel communications system 202 is also configured to transmit over a single channel, e.g. one communications link, at any time while simultaneously receiving one or more channels. If the power amplifier in the subsequently described wideband transmitter front end has sufficient linearity so as to avoid creating interference, e.g. intermodulation distortion products, the multichannel transceiver 210 is also configured to transmit two or more channels simultaneously, even while the receiver 210A is receiving on other channel(s). The power amplifier can be linearized by using pre-distortion.

Communications channel, or channel, means a frequency band, e.g. a frequency. Optionally, the multichannel communications system 202 operates in the Very High Frequency (VHF) spectrum (e.g. 118-137 MHz); however the multichannel communications system 202 can be designed to operate in other frequency spectrums, such as the High Frequency (HF) spectrum (e.g. 3-30 MHz), or in a combination of spectrums such as the HF and VHF spectrums.

The illustrated embodiment of the multichannel communications system 202 comprises a wideband remote radio system 222 coupled to a baseband processing system or baseband system 224 and to at least one antenna 226. Optionally, the wideband remote radio system 222 is a system that is located remotely, i.e. in a different location, from the baseband processing system 224. For example, the wideband remote radio system 202 is located proximate, or adjacent, to the antenna(s) to which it is coupled. The baseband processing system 224 may be located elsewhere in the vehicle, e.g. proximate to the cockpit. However, alternatively, the wideband remote radio system 202 and the baseband processing system 224 may be co-located. The baseband processing system 224 and the wideband remote radio system 222 may be coupled by at least one data bus (e.g. one or more Ethernet buses).

In one embodiment, the wideband remote radio system comprises a wideband receiver front end (wideband Rx front end) 222A and a wideband transmitter front end (wideband Tx front end) 222B respectively having an output and an input respectively coupled to an analog to digital converter circuit (ADC) 222C and a digital to analog converter circuit (DAC) 222D. The input of the wideband receiver front end 222A and a wideband transmitter front end 222B are respectively coupled to the at least one antenna. The term 'front end' may also be referred to herein as 'front end system'.

Baseband processing system as used herein means a system that at least digitally processes digitized audio and data (e.g. data messages) received from the wideband remote radio system, filters the digital audio signals, screens the data messages, converts the digital audio and data messages to the appropriate format for distribution and routes them to the appropriate vehicle end system. The baseband processing system accepts digital or analog audio input signals and data messages from other vehicle systems, digitizes the analog audio signals or converts the digital audio signals to the appropriate digital encoding format, encodes the data messages into the appropriate digital data stream and routes the digital audio and encoded data to the wideband remote radio system for transmission over the appropriate radio frequency (RF) channel/link. Wideband remote radio system as used herein means a system that at least amplifies, filters and digitizes received modulated RF carrier signals, and which also performs digital to analog format conversion of digital signals to be transmitted, filters and translates the analog converted signals to the RF carrier signal(s), and amplifies the modulated RF signals. The baseband processing system and the wideband remote radio system are housed in different enclosures.

When receiving, one or more analog format RF carrier signals modulated with data are simultaneously received by the wideband remote radio system 222 through the at least one antenna 226. Some of the RF carrier signals may be signals of interest associated with selected RF channels and some others may be undesired signals occupying other RF channels. The ADC 222C converts the multitude of desired and undesired RF carrier signals from analog to digital format for downstream digital signal processing. While transmitting, one or more digital format signals are provided to the wideband remote radio system 222 for upstream digital signal processing and conversion into RF signals. The DAC 222D converts the digitally modulated RF signals from digital to analog format; such converted signals are subsequently amplified and transmitted, e.g. broadcast from the at least one antenna 226.

In one embodiment, the wideband receiver front end 222A includes a low noise amplifier. The low noise amplifier increases the signal level of the received analog format RF carrier signals modulated with data that is received by the at least one antenna 226 to a level that is detectable above the noise generated by downstream components, while at the same time generating little noise itself. Optionally, the wideband receiver front end 222A includes a receive filter, e.g. a bandpass filter, coupled to the low noise amplifier and having a passband substantially equivalent to the operating frequency spectrum of the multichannel communications system 202. The receive filter may be coupled between the at least one antenna 226 and the low noise amplifier, or between the low noise amplifier and the ADC 222C. The receive filter suppresses out of band signals which may interfere with in band signals desired to be received.

In another embodiment, the wideband transmitter front end 222B includes a power amplifier. Optionally, the wideband transmitter front end 222B includes a transmit filter, e.g. a bandpass filter, coupled to the power amplifier and having a passband substantially equivalent to the operating frequency spectrum of the multichannel communications system 202. The transmit filter may be coupled between the at least one antenna 226 and the power amplifier, or between the power amplifier and the DAC 222D. The transmit filter suppresses out of band emissions which may interfere with other communications systems operating in adjacent bands (e.g. in the case of wideband multi-carrier transmissions) and/or in adjacent channels within the same operating band (e.g. in single carrier transmissions).

Optionally, if the at least one antenna 226 is a single antenna, then a transmit/receive duplexer (Tx/Rx duplexer) 222F couples the at least one antenna 226 to the wideband receiver front end 222A and a wideband transmitter front end 222B. The Tx/Rx duplexer 222F can be implemented, e.g., by a diplexer or a cavity duplexer when the communications system is designed for frequency division duplex operation, or by a Tx/Rx switch when the radio system is designed for time division duplex operation or push-to-talk/carrier sense duplex operation. Alternatively, the wideband receiver front end 222A and the wideband transmitter front end 222B are coupled to separate receive and transmit antennas. The at least one antenna 226 may be one or more of a vertical monopole, Yagi, parabolic reflector (i.e. dish), patch, and/or phased array antenna(s). The antenna is typically mounted on, in, or inside of and proximate to, the exterior of the vehicle 101.

Optionally, the wideband remote radio system 222 includes a multichannel digital front end processing system 222E. The multichannel digital front end processing system 222E includes at least one digital up converter and at least one digital down converter that respectively digitally modulates and demodulates selected RF carrier(s) of interest while rejecting the undesired channels; such modulation and demodulation, for example, may be respectively performed using and produce digitally generated complex sinusoids. The multichannel digital front end processing system 222E may optionally also include physical layer signal processing of the digital signals that are demodulated from selected received RF carrier(s) and the physical layer signal processing of the digital signals that modulate selected transmitted RF carrier(s), e.g. digital filtering for adjacent channel rejection, data demodulation, and forward error correction decoding of selected receive RF carrier(s), and forward error correction data encoding, modulation data encoding and digital filtering to shape the spectrum of selected transmitted RF carrier(s). Optionally, such physical layer signal processing of the selected channels can be implemented in the subsequently described multichannel digital back end processing system 224A instead of the multichannel digital front end processing system 222E. The at least one digital up converter and the at least one digital down converter may be respectively implemented by digital up converter circuitry and digital down converter circuitry. The at least one digital up converter receives digitally encoded data samples of audio signals and/or data messages and modulates the selected transmit carrier frequency in the operating frequency spectrum of the wideband transmitter front end 222B, e.g. the multichannel communications system 202. The digitally encoded data is provided from the physical layer digital signal processing modulation/encoding function, which may be included in the multichannel digital front end processing system 222E or in the digital back end processing system 224A within the baseband processing system 224. The at least one digital down converter receives digital samples of a composite of all the received RF signals occupying the bandwidth of the wideband receiver front end 222A from the ADC 222C. The at least one digital down converter mixes the digital samples provided by the wideband receiver front end 222A with at least one digital sinusoid whose frequency is equal to the center frequency of the RF channel associated with the at least one selected RF channel; as a result the digital samples of the wideband RF signal are translated to baseband. The baseband signals are digitally filtered to select and output digital samples of the at least one selected carrier frequency while rejecting undesired signals occupying adjacent channels within the operating frequency spectrum of the wideband receiver front end 222A. The baseband digital data is provided to the physical layer digital demodulation/decoding function which may be included in the multichannel digital front end processing system 222E or in the digital back end processing system 224A. Correspondingly, physical layer digital modulation/coding function may be included in the multichannel digital front end processing system 222E, or in the digital back end processing system 224A.

The baseband processing system 224 includes a multichannel digital back end processing system 224A coupled to a datalink communications management system 224B and an audio processing system 224C. The multichannel digital back end processing system 224A comprises at least the functionality associated with protocols for the datalink layer of the open systems interconnection (OSI) model, e.g. pertaining to RF media access control (e.g. a time division multiple access protocol), logical link control (e.g. a retransmission protocol), radio control (including channel selection), transmit/receive switching control, data error detection and correction, and addressing and address screening. For example, the protocols facilitate access of selected RF channel(s) in transmit and receive modes, to determine whether the received data consists of digital audio signals or data (e.g. data messages), and to route the digital audio signals and data such as data messages.

The signal processing circuitry of the multichannel digital back end processing system 224A also performs a squelch function on channels that are configured for voice operation by muting the received digital audio signal output to the digital signal processing system when the received signal is determined to consist only of noise or when the received carrier signal strength falls below a threshold level. The squelch function is only performed when there is an indicia that an audio signal may be received, e.g. due to data in a protocol decoded by the multichannel digital back end processing system 224A, or because the channel is configured for voice. Thus, for example, the wideband receiver front end 222A or the multichannel digital front end processing system 222E determines the received carrier signal strength of signals on channels where audio signals are being detected, and provides such received carrier signal strength to the multichannel digital backend processing system 224A.

In some embodiments the multichannel digital back end processing system 224A may also include the physical layer signal processing that (a) generates a baseband modulation encoded signal data stream (e.g. phase shift keying data symbols) which modulate the complex sinusoid generated by the digital up converter, and (b) detects and decodes a stream of digital data (e.g. phase shift keying data symbols) from the baseband digital samples output when such functionality is not included in the multichannel digital front end processing system 222E. For example, the aforementioned modulation encoding and decoding respectively converts binary data to and from more complex coding symbols such as for example phase shift keying or amplitude modulation symbols.

The inputs and outputs of the multichannel digital back end processing system 224A are (a) digital data messages respectively provided by and to the datalink communications management system 224B, and (b) digital audio signals respectively provided by and to the audio processing system 224C. The datalink communications management system 224B may also be referred to as a communications management system. Data messages are text messages similar to instant or e-mail messages. Audio signals are voice signals, e.g. of a pilot or air traffic controller.

The baseband processing system 224 is configured to facilitate transmitting and receiving data messages, e.g. between a vehicle system or a vehicle operator such as a pilot, and an entity external to the vehicle (e.g., (a) an operations center of the entity that owns or controls the vehicle 101, (b) a traffic control center, or (c) another vehicle). The baseband processing system 224 is also configured to facilitate transmitting and receiving audio signals (unconverted audio signals), e.g. between the vehicle operator and an entity external to the vehicle (e.g., (a) an operations center of the entity that owns or controls the vehicle 101, (b) a traffic control center, or (c) another vehicle).

The audio processing system 224C couples at least one vehicle audio system (vehicle audio system(s)) to the multichannel digital backend processing system 224A. The vehicle audio system(s) may include an audio distribution system that distributes the audio within the vehicle. The audio processing system 224C includes at least digital signal processing functionality that converts input audio signals from the vehicle audio sources to the appropriate digital audio stream for transmission over the selected RF channel/RF medium and converts digital audio signals received over the selected RF channel/RF medium to the appropriate format for output and distribution to the vehicle receiving end audio systems. The audio inputs and outputs of the baseband processing system 224 may be analog or digital. Sources of analog audio input signals may be from microphones in the cockpit of the vehicle 101. Analog audio signals may be output to speaker(s), e.g. in the vehicle cockpit, and/or headset(s), e.g. worn by the operators of the vehicle 101. If the audio inputs and outputs are analog, audio processing system 224C also includes at least one analog to digital converter circuit and at least one digital to analog converter circuit. Optionally, the digital signal processing circuitry may filter the digitized audio signals to be transmitted and the received audio signals to remove, e.g., noise and spurious signals that are outside the spectrum occupied by the audio signal, e.g. 300-3000 kHz. The digitized audio signals to be transmitted and the received digital audio signals are coupled from the audio processing system 224C to the multichannel digital backend processing system 224A.

Optionally, the audio processing system 224C may receive and transmit digital audio signals (instead of analog audio signals) respectively from and to vehicle audio system(s). In this case, the audio processing system 224C would convert continuous digital audio signals received from the vehicle audio system(s) to packetized digital audio signals. Conversely, the audio processing system 224C would convert packetized digital audio signals received from the multichannel digital back end processing system 224A to continuous digital audio signals. The audio processing system 224C provides analog or digital conversion depending upon the whether the vehicle audio system(s) provide and receive digital or analog audio format.

Each of the at least one analog to digital converter and the at least one digital to analog converter is optional. The headsets, speakers, and/or microphones may have digital input/outputs (I/Os). Alternatively, the at least one analog to digital converter and/or the at least one digital to analog converter may be bypassed if the corresponding output and/or input of a headset, speaker, and/or microphone has a digital signal format, e.g. such as TOSLINK.

The datalink communications management system 224B comprises at least one datalink router. The at least one datalink router is configured to route data messages between the multichannel communications system 202 and at least one other vehicle system, e.g. a flight management unit, a central maintenance computer, or an application in the datalink management system (e.g., ARINC 623 aircraft communications, addressing and reporting systems (ACARS) application, Airline Operations Center ACARS application, and/or protected mode (PM) controller-pilot datalink communications (CPDLC) Aeronautical Telecommunication Network (ATN) application. The datalink communications management system 224B may include other datalink applications such as an automatic dependent surveillance system application.

The at least one datalink router may comprise a unique datalink router for different data message protocols used by the multichannel communications system 202, e.g. ACARS protocol, ATN/Open Systems Interconnection (OSI) protocol, Internet Protocol, and/or any other protocol. Optionally, the at least one datalink router comprises an ACARS router, an ATN/OSI router, and/or an IP router (such as an ATN/IPS router) if ACARS protocol, ATN/OSI, and/or IP messages are configured to be routed by the at least one datalink router. Alternatively, one or more routers may facilitate routing messages of two or more protocols.

The datalink communications management system 224B may be implemented by a processing system comprising processing circuitry coupled to memory circuitry. The at least one datalink router may be implemented in software stored in the memory circuitry and executed by the processing circuitry.

Optionally, the datalink communications management system 224B may comprise at least one datalink application, e.g. messaging applications, for example traffic control messaging application(s) (such as air traffic control messaging application(s) like an ARINC 623 ACARS Air Transport Services (ATS) ACARS application or a PM CPDLC ATN application) and/or operations center messaging application(s) (such as airline operations center messaging application(s)). A messaging application in the datalink communications management system 224B utilizes one of the communications protocols in the at least one datalink router. Thus, for example, there may be one or more messaging applications for ACARS protocol, ATN/OSI protocol, and/or IP messages.

Optionally, the baseband processing system 224 comprises a radio management, and/or reporting (RMR) system 224D. The RMR system 224D comprises a radio resource management system 224D-1, a health monitoring system 224D-2, and/or a reporting system 224D-3. In one embodiment, the baseband processing system 224 includes processing circuitry such as the digital processing circuitry and/or other circuitry, coupled to memory circuitry. The RMR system 224D may be implemented in such processing circuitry coupled to such memory circuitry. In this embodiment, the RMR system 224D including its component(s) may be implemented as software stored in the memory circuitry and executed by the processing circuitry. The RMR system 224D (and two or more of its components such as the radio resource management system 224D-1 and the health monitoring system 224D-2) are communicatively coupled to the wideband remote radio system 222 through the multichannel digital back end processing system 224A. The RMR system 224D, and one or more of its components, may be coupled to other vehicle system(s); for example the reporting system 224D-3 may be coupled to a central maintenance computer.

The radio resource management system 224D-1 obtains information, e.g. from systems operated by vehicle operator(s) and/or the datalink communications management system 224B to configure the operation of the multichannel digital front end processing system 222E and/or the multichannel digital back end processing system 224A, e.g. to determining the frequency or frequencies used for reception and transmission. Optionally, the baseband processing system may be coupled to a vehicles navigations system; based upon vehicle location, the radio resource management system may change the channels of one or more wideband remote radio systems and/or may reconfigure wideband remote radio systems to communicate data rather than audio, or vice versa.

The health monitoring system 224D-2 monitors the operational status and performance of the wideband remote radio system 222 and components thereof; it further identifies failures of any of such system and components. The reporting system 224D-3 sends messages and/or indicators to vehicle operators, other vehicle system(s) (e.g. a central maintenance computer), and entit(ies) external to the vehicle (e.g. as illustrated elsewhere herein).

Figure 3:
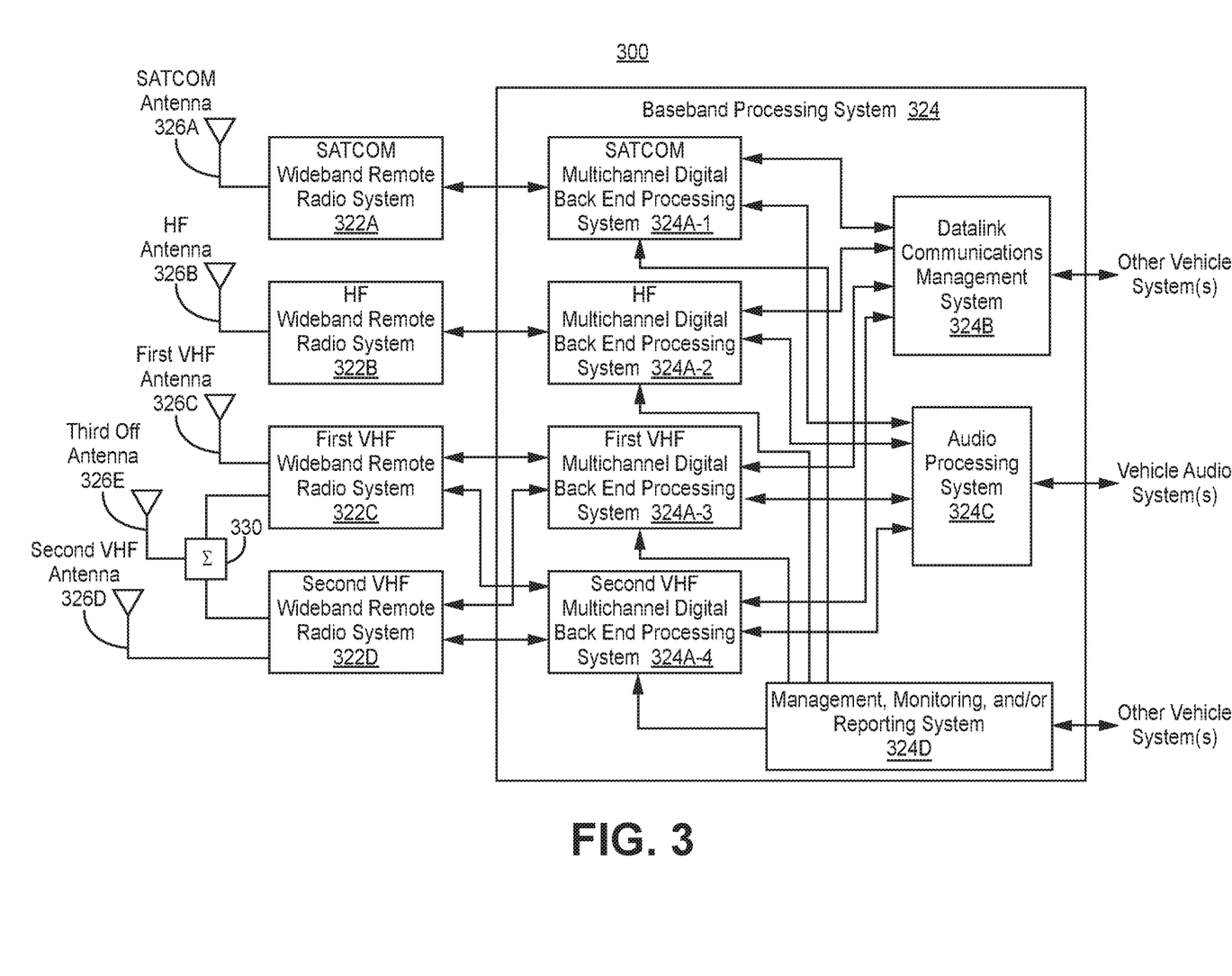
FIG. 3 illustrates an embodiment of a system with multiple multichannel communications systems.

FIG. 3 illustrates an embodiment of a system with multiple multichannel communications systems (multi-system) 300. The multi-system 300 comprises separate wideband remote radio systems for different frequency spectrums, e.g. HF, VHF, and satellite communications (SATCOM) (e.g. 1545-1559 MHz receive band and 1626.5-1660.5 MHz transmit band in L-Band). In the illustrated embodiment, there is a SATCOM wideband remote radio system 322A, an HF wideband remote radio system 322B, a first VHF wideband remote radio system 322C, and a second VHF wideband remote radio system 322D. However other combinations of wideband remote radio systems may be employed, e.g. with a single VHF wideband remote radio system and/or without at least one of the SATCOM wideband remote radio system 322A and the HF wideband remote radio system 322B. Optionally, the illustrated VHF communications components may be configured by a datalink communications management system to have at least two digital data modes including Mode A and Mode 2 (which operates at a higher data rate of 31.5 kbps) when operating in a data mode. The wideband remote radio systems may each be implemented as described above for the wideband remote radio system 222.

A SATCOM antenna 326A is coupled to the SATCOM wideband remote radio system 322A. An HF antenna 326B is coupled to the HF wideband remote radio system 322B. A first VHF antenna 326C and a third VHF antenna 326E are coupled to the first VHF wideband remote radio system 322C. A second VHF antenna 326D and the third VHF antenna 326E are coupled to the second VHF wideband remote radio system 322D.

Each of the wideband remote radio systems illustrated in FIG. 3 may be implemented and operate as described above for the wideband remote radio system 222 with the following differences regarding duplex (Transmit/Receive) operation. The mobile satellite system frequency band of 1545-1559 MHz and 1626.5-1660.5 MHz is allocated to support simultaneous receive and transmit using frequency division duplex (FDD) operation. Hence wideband simultaneous multichannel transmit/receive operation can be supported using a diplexer to isolate the receive channels from interference from the transmit channels. The mobile SATCOM frequency band of 1610-1626 MHz is on the other hand allocated for simultaneous receive and transmit operation using time division duplex (TDD). Hence wideband multichannel operation in a multi-user environment is achieved using transmit/receive switching synchronized to a common timing source, which is typically provided by a satellite service provider.

However, the aeronautical VHF band 118-137 MHz, the military VHF band 30-88 MHz, the V/UHF band 225-400 MHz, and the land mobile radio band 380-470 MHz are allocated for push-to-talk duplex operation with unsynchronized switching between transmit and receive operation. In order to support simultaneous multichannel transmit and receive operation, e.g. in the VHF band, the first VHF wideband remote radio system 322C and the second VHF wideband remote radio system 322D are implemented differently with the addition of the third VHF antenna 330.

The third VHF antenna 326E is a dedicated receive antenna coupled to the first VHF wideband remote radio system 322C and the second VHF wideband remote radio system 322D by a combiner (Σ) 330, e.g. implemented with coupled transmission lines or parallel filter circuits. The third VHF antenna 326E is coupled to a common port of the combiner 330. The first port and second port of the combiner 330 are respectively coupled to a wideband receive front end in each of the first VHF wideband remote radio system 322C and the second VHF wideband remote radio system 322D. As will be further described, the first VHF antenna 326C, the second VHF antenna 326D, and the common port of the combiner 330 are coupled to switches of the duplexers in the first VHF wideband remote radio system 322C and the second VHF wideband remote radio system 322D.

Each transmit/receive duplexer in the first VHF wideband remote radio system 322C and the second VHF wideband remote radio system 322D is replaced by a switching system. The switching system comprises with a pair of switches, e.g. single pole double throw switched. More than two wideband remote radio systems can be coupled by the switching system; however, the number of switches and poles of the switches will vary depending upon the number of wideband remote radio systems that are coupled by the switching system. Such switches may be implemented with relays, PIN diodes, and/or transistors.

The common port of each of the first switches is respectively coupled to an input of the wideband receiver front end of the corresponding VHF wideband remote radio system. The first port of each of the first switches is coupled to a first port of the second switch. The second port of each of the first switches is coupled to the coupler.

The common port of each of the second switches is coupled to the corresponding VHF antenna not coupled to the corresponding VHF wideband remote radio system not through the coupler 330 (e.g. the first VHF antenna 326C or the second VHF antenna). The second port of each of the second switches is coupled to an output of the wideband transmitter front end of the corresponding VHF wideband remote radio system.

Thus, if a VHF wideband remote radio system is used for transmission, its second switch couples its wideband transmitter front end to its VHF antenna (not coupled through the coupler 330). Also, the VHF wideband remote radio system may also be simultaneously used for reception by coupling its wideband receiver front end to the coupler, and thus to another VHF antenna. If the VHF wideband remote radio system is only used for reception, then its second switch couples its wideband receiver front end to its VHF antenna (not coupled through the coupler 330).

The first and second switches may be controlled by the digital functionality in the wideband remote radio system and/or the baseband processing system that controls the transmit/receive operation of the radio.

With the foregoing implementation, each of the first VHF wideband remote radio system 322C and the second VHF wideband remote radio system 322D can simultaneously transmit on one channel and receive on one or more different channels. The foregoing implementation can be expanded by adding more VHF wideband remote radio systems and corresponding transmit antennas to increase the number of VHF channels over which signals can be simultaneously transmitted. Further, the coupler 330 can be expanded to include a corresponding number of ports to be coupled to the additional VHF wideband receiver front ends. Further, this technique need not be implemented with or only for VHF wideband remote radio systems; it can be implemented with wideband remote radio systems in one or more other spectra that is allocated for unsynchronized push-talk duplex operation, e.g. the military and land-mobile radio UHF spectra.

Returning to FIG. 3, the SATCOM wideband remote radio system 322A, the HF wideband remote radio system 322B, the first VHF wideband remote radio system 322C, and the second VHF wideband remote radio system 322D are coupled to the baseband processing system 324, and more particularly respectively to a SATCOM multichannel digital backend processing system 324A-1, a HF multichannel digital backend processing system 324A-2, a first VHF multichannel digital backend processing system 324A-3, and a second VHF multichannel digital backend processing system 324A-4 each of which may be implemented and operate as described above with respect to the multichannel digital back end processing system 224A. Each of the first VHF wideband remote radio system 322C and the second VHF wideband remote radio system 322D are coupled to both the first VHF multichannel digital backend processing system 324A-3 and the second VHF multichannel digital backend processing system 324A-4. As a result, uplink and downlink signals to and from either VHF wideband remote radio system can be processed by either VHF multichannel digital backend processing system. That is, the RF link layer control processing functionality hosted in a VHF multichannel digital backend processing system can make efficient use of RF channels supported by the two VHF wideband remote radio systems to dynamically route downlink transmit data and voice to whichever transmitter in a VHF wideband remote radio system is available. Coupled pairs of a baseband processing system and a wideband remote radio system may be coupled by at least one data bus (e.g. one or more ARINC 429 buses) or at least one RF cable, e.g. a coaxial cable.

Each of the SATCOM multichannel digital backend processing system 324A-1, the HF multichannel digital backend processing system 324A-2, the first VHF multichannel digital backend processing system 324A-3, and the second VHF multichannel digital backend processing system 324A-4 are coupled to a datalink communications management system 324B and an audio processing system 324C. The operation and implementation of the datalink communications management system 324B and the audio processing system 324C may be as described above for the datalink communications management system 224B and the audio processing system 224C.

Optionally, the multi-system 300 includes a RMR system 324D as described above for FIG. 2. The RMR system 324D may be implemented as described above with respect to RMR system 224D. The RMR system 324D is part of the baseband processing system 324. The RMR system 324D (and two or more of its components such as the radio resource management system and the health monitoring system) are coupled to each of the SATCOM wideband remote radio system 322A, the HF wideband remote radio system 322B, the first VHF 322C, and the second VHF wideband remote radio system 322D through corresponding multichannel digital back end processing systems as illustrated in FIG. 3. The RMR system 324D (and one or more of its components such as the reporting system) may be coupled to other vehicle system(s), e.g. a central maintenance computer.

Optionally, the multi-system 300 may include a second SATCOM antenna coupled to a second SATCOM wideband remote radio system coupled to a second SATCOM multichannel digital back end processing system. The second SATCOM multichannel digital back end processing system would be coupled to the datalink communications management system 324B, the audio processing system 324C, and the management, monitoring, and/or reporting (RMR) system 324D.

Optionally, the multi-system 300 may include a second HF wideband remote radio system 322A coupled to the HF antenna 326B and a second HF multichannel digital back end processing system. The second HF multichannel digital back end processing system would be coupled to the datalink communications management system 324B, the audio processing system 324C, and the management, monitoring, and/or reporting system 324D. The HF wideband remote radio system 322B and the second HF wideband remote radio system may include internal RF switches to isolate one radio form the HF antenna 326B when the one of the HF wideband remote radio systems is transmitting.

Figure 4:
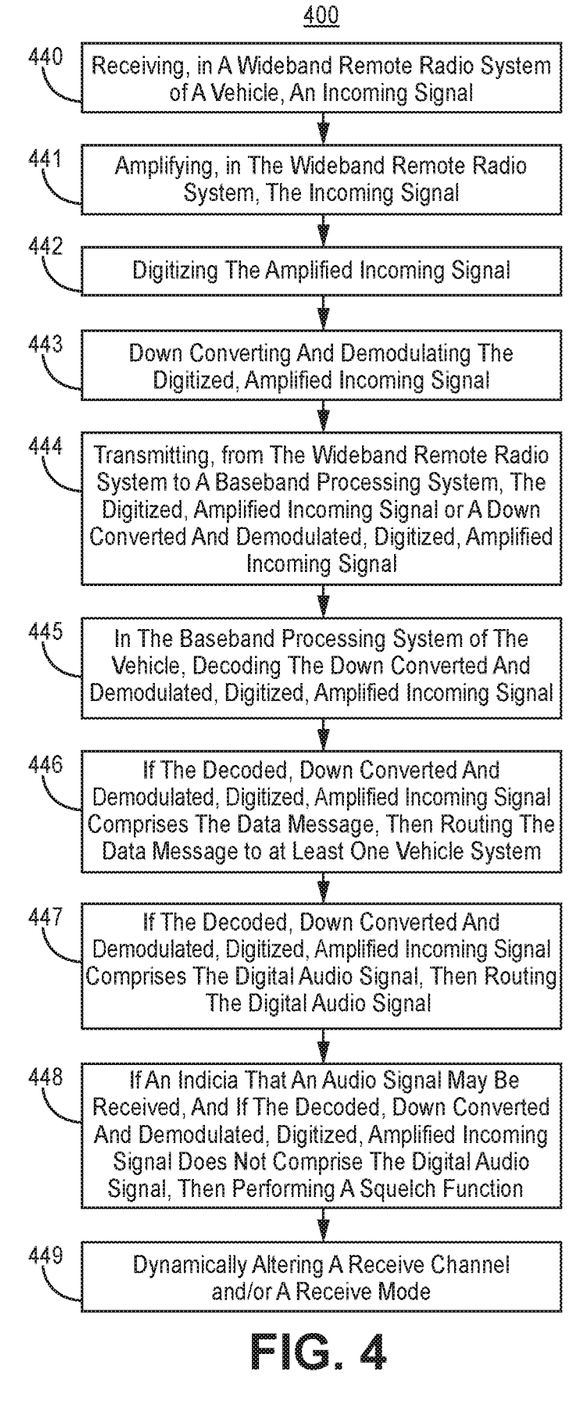
FIG. 4 illustrates one embodiment of a method for receiving signals with a multichannel communications system.

FIG. 4 illustrates one embodiment of a method 400 for receiving signals with a multichannel communications system. To the extent that the embodiment of method 400 shown in FIG. 4 is described herein as being implemented in the systems shown in FIGS. 1-3, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 440, receive, in a wideband remote radio system of a vehicle, an incoming signal comprising at least one of an up converted data (e.g. data messages) and an up converted audio signal. The up converted data and the up converted audio signal are modulated carrier signals. In block 441, amplify, in the wideband remote radio system of the vehicle, the incoming signal, e.g. to increase the incoming signal's signal to noise ratio. In block 442, digitize, in the wideband remote radio system of the vehicle, the amplified incoming signal, e.g. with an analog to digital converter. Optionally, filter, in the wideband remote radio system, the amplified incoming signal, e.g. with digital signal processing circuitry.

In block 443, down convert and demodulate, in one of the wideband remote radio system or the baseband processing system of the vehicle, the digitized, amplified incoming signal (or amplified digital incoming signal). In block 444, transmit, from the wideband remote radio system to the baseband processing system, the digitized, amplified incoming signal or a down converted and demodulated, digitized, amplified incoming signal (or down converted and demodulated, amplified digital incoming signal).

In block 445, in the baseband processing system of the vehicle, decode the down converted and demodulated, digitized, amplified incoming signal to create at least one of a data and a digitized, or digital, audio signal. In block 446, if the decoded, down converted and demodulated, digitized, amplified incoming signal comprises the data, then, in the base band processing system of the vehicle, route the data to at least one of: (a) at least one vehicle system, and (b) at least one application in the baseband processing system, e.g. in the datalink communications management system 224B, 324B. Optionally, route the data using a datalink router corresponding to the data protocol of the data. In block 447, if the decoded, down converted and demodulated, digitized, amplified incoming signal comprises the digital audio signal, then, in the baseband processing system of the vehicle, route the digitized audio signal to at least one vehicle audio system. Optionally, in the baseband processing system, prior to routing the audio signal, convert the digitized audio signal to an analog audio signal, and then route the analog audio signal to the at least one vehicle audio system. Optionally, in the baseband processing system, prior to routing the audio signal, filtering the audio signal. Optionally, in block 448, if an indicia that an audio signal may be received and if the decoded, down converted and demodulated, digitized, amplified incoming signal does not comprise the digital audio signal, then, in the baseband processing system of the vehicle, perform a squelch function. Optionally, in block 449, dynamically, e.g. based upon geographic location of the vehicle, alter at least one of: a receive channel of the wideband processing system or a receive mode of the baseband processing system with respect to at least one channel, where the receive mode is one of data and audio.

Figure 5:
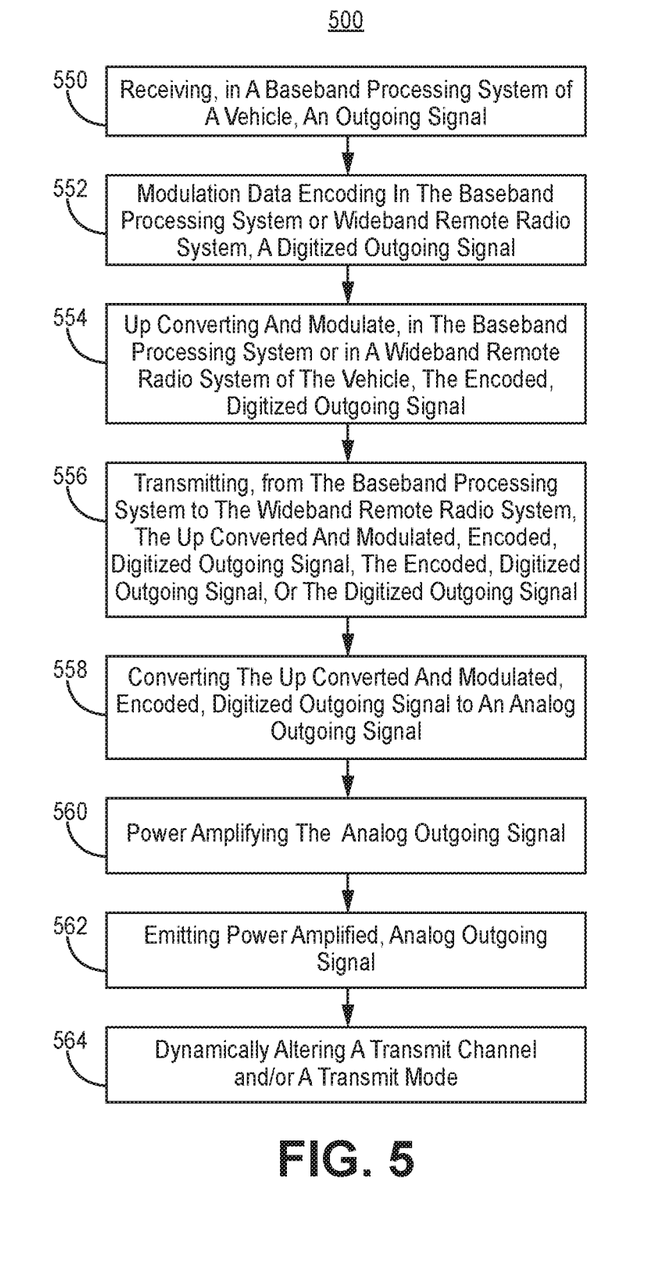
FIG. 5 illustrates one embodiment of a method 500 for transmitting signals with a multichannel communications system.

FIG. 5 illustrates one embodiment of a method 500 for transmitting signals with a multichannel communications system. To the extent that the embodiment of method 400 shown in FIG. 4 is described herein as being implemented in the systems shown in FIGS. 1-3, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 550, receive, in a baseband processing system of a vehicle, an outgoing signal comprising at least one of a data and an audio signal. Optionally, if the audio signal is an analog signal, then, in the baseband processing system of the vehicle, digitize the audio signal. The data may originate in at least one of: (a) at least one vehicle system and (b) at least application in the baseband processing system.

In block 552, modulation data encode, in the baseband processing system of the vehicle, a digitized outgoing signal. In block 554, up convert and modulate, in the baseband processing system or in a wideband remote radio system of the vehicle, the encoded, digitized outgoing signal. In 556, transmit, from the baseband processing system to the wideband remote radio system of the vehicle, the up converted and modulated, digitized outgoing signal, the encoded, digitized outgoing signal, or the digitized outgoing signal. In block 558, convert, in the wideband remote radio system, the up converted and modulated, encoded, digitized outgoing signal to an analog outgoing signal. In block 560, power amplify, in the wideband remote radio system of the vehicle, the analog outgoing signal. Optionally, filter, in the wideband remote radio system of the vehicle, the analog outgoing signal prior to or after power amplification. In block 562, emit the power amplified, analog outgoing signal. Optionally, in block 564, dynamically, e.g. based upon vehicle location, alter at least one of a transmit channel of the wideband processing system or a transmit mode of the baseband processing system with respect to at least one channel, where the transmit mode is one of data and audio.

Incoming signal means a signal received by a communications system on the vehicle. Outgoing signal means a signal transmitted by a communications system on the vehicle.

Exemplary Embodiments

Example 1 includes a communications system, comprising: a baseband system; a wideband remote radio system coupled to the baseband system; wherein the wideband remote radio system comprises a digital to analog data converter configured to convert a downlink digital signal to a downlink analog signal, and an analog to digital converter configured to convert a wideband uplink digital signal to a wideband uplink analog signal; wherein the baseband system comprises a datalink communications management system and an audio processing system; wherein the wideband radio baseband system is coupled to the audio processing system and the datalink communications management system; wherein at least one of the baseband system and the wideband remote radio system is configured to simultaneously demodulate at least two radio channels.

Example 2 includes the communications system of Example 1, wherein the datalink communications management system comprises at least one of: a datalink router and at least one datalink application.

Example 3 includes the communications system of any of Examples 1-2, wherein the audio processing system provides audio filtering, squelch filtering, and analog or digital conversion.

Example 4 includes the communications system of any of Examples 1-3, wherein the wideband remote radio system further comprises: a wideband receiver front end coupled to the analog to digital converter; a wideband transmitter front end to the digital to analog converter; and wherein the wideband receiver front end and the wideband transmitter front end are configured to be coupled to at least one antenna.

Example 5 includes the communications system of Example 4, further comprising a transmit/receive duplexer configured to be coupled between the at least one antenna, and each of the wideband receiver front end and the wideband transmitter front end.

Example 6 includes the communications system of any of Examples 4-5, wherein: the wideband remote radio system further comprises a multichannel digital front end processing system coupled to the analog to digital converter and the digital to analog converter; and wherein baseband system further comprises a multichannel digital back end processing system coupled to the datalink communications management system and an audio processing system; and wherein one of the multichannel digital front end processing system and the multichannel digital back end processing system is configured to provide a digital decoding of modulation symbols and digital encoding of modulation symbols.

Example 7 includes the communications system of any of Examples 1-6, wherein the baseband processing system further comprises at least one of: a radio resource management system, a health monitoring system, and a reporting system.

Example 8 includes a communications system, comprising: at least one wideband remote radio system each of which is configured to be coupled to at least one antenna; a baseband system coupled to each of the at least one wideband remote radio system; wherein at least one wideband remote radio system and the baseband system are in different locations of a vehicle; wherein the baseband system comprises a datalink communications management system and an audio processing system; and wherein the at least one wideband radio baseband system is coupled to the audio processing system and the datalink communications management system.

Example 9 includes the communications system of Example 8, wherein the datalink communications management system comprises a datalink router and at least one datalink application.

Example 10 includes the communications system of any of Examples 8-9, wherein the audio processing system provides audio filtering, squelch filtering, and analog or digital conversion.

Example 11 includes the communications system of any of Examples 8-10, wherein each of the at least one wideband remote radio system further comprises: an analog to digital converter; a digital to analog converter; a wideband receiver front end coupled to the analog to digital converter; a wideband transmitter front end to the digital to analog converter; and a multichannel digital front end processing system coupled to the analog to digital converter and the digital to analog converter; and wherein the baseband processing system comprises a multichannel digital back end processing system coupled to the datalink communications management system and the audio processing system.

Example 12 includes the communications system of Example 11, wherein at least one of the at least one of wideband remote radio system comprises a transmit/receive duplexer configured to be coupled between the at least one antenna, and each of the wideband receiver front end and the wideband transmitter front end.

Example 13 includes the communications system of any of Examples 8-12, further comprising: another at least one antenna; a coupler coupled to the another at least one antenna; and wherein each of two of the at least one wideband remote radio system comprises: an antenna, a wideband receiver front end, a wideband transmitter front end, and a switching system coupled to the wideband receiver front end, the coupler, the at least one antenna, and the wideband transmitter front end.

Example 14 includes the communications system of Example 13, wherein the baseband processing system comprises two multichannel digital back end processing systems, where each such multichannel digital back end processing system is coupled to each of the two of the at least one wideband remote radio system; and wherein each multichannel digital back end processing system is configured to dynamically route transmit data and receive data respectively to and from one wideband remote radio system.

Example 15 includes the communications system of any of Examples 8-14, wherein the baseband processing system further comprises at least one of: a radio resource management system, a health monitoring system, and a reporting system.

Example 16 includes a method, comprising: receiving, in a wideband remote radio system of a vehicle, an incoming signal comprising at least one of a modulated data and a modulated audio signal; amplifying, in the wideband remote radio system of the vehicle, the incoming signal; digitizing the amplified incoming signal; down converting and demodulating, in one of the wideband remote radio system or the baseband processing system of the vehicle, the digitized, amplified incoming signal; transmitting, from the wideband remote radio system to the baseband processing system, the digitized, amplified incoming signal or a down converted and demodulated, digitized, amplified incoming signal; in the baseband processing system of the vehicle, decoding the down converted and demodulated, digitized, amplified incoming signal to create at least one of a data and a digital audio signal; if the decoded, down converted and demodulated, digitized, amplified incoming signal comprises a data message, then, in the baseband processing system of the vehicle, routing the data to at least one of: (a) at least one vehicle system, and (b) at least one application in the baseband processing system; and if the decoded, down converted and demodulated digitized, amplified incoming signal comprises a digitized audio signal, then, in the baseband processing system of the vehicle, routing the digitized audio signal to at least one vehicle audio system.

Example 17 includes the method of Example 16, further comprising prior to routing the audio signal, converting the digitized audio signal to an analog audio signal, and then route the analog audio signal to the at least one vehicle audio system.

Example 18 includes the method of any of Examples 16-17, further comprising: receiving in a baseband processing system of the vehicle, an outgoing signal comprising at least one of a data and an audio signal; modulation data encoding, in the baseband processing system or in the wideband remote radio system of the vehicle, a digitized outgoing signal; up converting and modulating, in the baseband processing system or in the wideband remote radio system of the vehicle, the encoded, digitized outgoing signal; transmitting, from the baseband processing system to the wideband remote radio system, the up converted and modulated, encoded, digitized outgoing signal, the encoded, digitized outgoing signal, or the digitized outgoing signal; converting the up converted and modulated, encoded, digitized outgoing signal to an analog outgoing signal; and power amplifying the analog outgoing signal.

Example 19 includes the method of Example 18, wherein if the audio signal of the outgoing signal is an analog audio signal, then digitizing the audio signal.

Example 20 includes the method of any of Examples 16-19, dynamically altering at least one of channel of the wideband processing system and operation mode of the baseband processing system with respect to the at least one channel, where operation mode is one of data and audio.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A communications system, comprising:
baseband circuitry configured to digitally process digitized audio and data messages received from wideband remote radio circuitry, to filter the digital audio signals, to screen the data messages, to convert formats of the digital audio and the data messages, and to route the digital audio and data messages to at least one of: (a) a vehicle system and (b) at least one application in the baseband circuitry, and where the baseband circuitry is housed in a first enclosure;
the wideband remote radio circuitry configured to amplify, downconvert, filter, and digitize received modulated carrier radio frequency signals and to perform digital to analog conversion of digital signals to be transmitted, and to upconvert and amplify the digital to analog converted signals, where the wideband remote radio circuitry is coupled to the baseband circuitry, and where the wideband remote radio circuitry is housed in a second enclosure;
wherein the wideband remote radio circuitry comprises multichannel digital front end processing circuitry, a digital to analog data converter circuitry, and an analog to digital converter circuitry;
wherein the baseband circuitry comprises a multichannel digital back end processing circuitry, datalink communications management circuitry, and audio processing circuitry, where the datalink communications management circuitry is configured to perform the routing of the data messages and the audio processing circuitry is configured to perform the routing of the digital audio signals;

wherein the wideband remote radio circuitry is coupled to the audio processing circuitry and the datalink communications management circuitry; and wherein at least one of the baseband circuitry and the wideband remote radio circuitry is configured to simultaneously demodulate at least two radio channels, where the at least two radio channels are received in at least one of a high frequency band, a very high frequency band, and satellite communications frequency band.

2. The communications system of claim 1, wherein the datalink communications management circuitry comprises at least one of: a datalink router and at least one datalink application.

3. The communications system of claim 1, wherein the audio processing circuitry is configured to provide audio filtering, squelch filtering, and analog or digital conversion.

4. The communications system of claim 1, wherein the wideband remote radio system further comprises:
a wideband receiver front end coupled to the analog to digital converter;
a wideband transmitter front end to the digital to analog converter; and
wherein the wideband receiver front end and the wideband transmitter front end are configured to be coupled to at least one antenna.

5. The communications system of claim 4, further comprising a transmit/receive duplexer configured to be coupled between the at least one antenna, and each of the wideband receiver front end and the wideband transmitter front end.

6. The communications system of claim 4, wherein:
the wideband remote radio system further comprises a multichannel digital front end processing system coupled to the analog to digital converter and the digital to analog converter; and
wherein baseband system further comprises a multichannel digital back end processing circuitry coupled to the datalink communications management circuitry and audio processing circuitry; and
wherein one of the multichannel digital front end processing circuitry and the multichannel digital back end processing circuitry is configured to provide a digital decoding of modulation symbols and digital encoding of modulation symbols.

7. The communications system of claim 1, wherein the baseband circuitry further comprises at least one of: a radio resource management system, a health monitoring system, and a reporting system.

8. A method, comprising:
receiving, in a wideband remote radio system of a vehicle, an incoming signal comprising at least one of a modulated data and a modulated audio signal;
amplifying, in the wideband remote radio system of the vehicle, the incoming signal;
digitizing the amplified incoming signal;
down converting and demodulating, in one of the wideband remote radio system or a baseband processing system of the vehicle, the digitized, amplified incoming signal, where the baseband processing system is in a first enclosure and comprising a multichannel digital backend processing circuitry, where the wideband remote radio system is in a second enclosure and comprises multichannel digital backend processing circuitry, where at least two radio channels are simultaneously demodulated, and where the at least two radio channels are received in at least one of a high frequency band, a very high frequency band, and satellite communications frequency band;
transmitting, from the wideband remote radio system to the baseband processing system, the digitized, amplified incoming signal or a down converted and demodulated, digitized, amplified incoming signal;
in the baseband processing system of the vehicle, decoding the down converted and demodulated, digitized, amplified incoming signal to create at least one of a data and a digital audio signal;
upon determining that a decoded, down converted and demodulated, digitized, amplified incoming signal comprises a data message, then, in the baseband processing system of the vehicle, routing with at least one datalink router the data to at least one of: (a) at least one vehicle system, and (b) at least one application in the baseband processing system; and
upon determining that the decoded, down converted and demodulated digitized, amplified incoming signal comprises a digitized audio signal, then, in the baseband processing system of the vehicle, routing with audio processing circuitry the digitized audio signal to at least one vehicle audio system.

9. The method of claim 8, further comprising prior to routing the audio signal, converting the digitized audio signal to an analog audio signal, and then routing the analog audio signal to the at least one vehicle audio system.

10. The method of claim 8, further comprising:
receiving in the baseband processing system of the vehicle, an outgoing signal comprising at least one of a data and an audio signal;
modulation data encoding, in the baseband processing system or in the wideband remote radio system of the vehicle, a digitized outgoing signal;
up converting and modulating, in the baseband processing system or in the wideband remote radio system of the vehicle, the encoded, digitized outgoing signal;
transmitting, from the baseband processing system to the wideband remote radio system, the up converted and modulated, encoded, digitized outgoing signal, the encoded, digitized outgoing signal, or the digitized outgoing signal;
converting the up converted and modulated, encoded, digitized outgoing signal to an analog outgoing signal; and
power amplifying the analog outgoing signal.

11. The method of claim 10, wherein if the audio signal of the outgoing signal is an analog audio signal, then digitizing the audio signal.

12. The method of claim 8, dynamically altering at least one of channel of the wideband processing system and operation mode of the baseband processing system with respect to the at least one channel, where operation mode is one of data and audio.

* * * * *